US011476409B2

(12) United States Patent
Le et al.

(10) Patent No.: US 11,476,409 B2
(45) Date of Patent: *Oct. 18, 2022

(54) SPIN-TRANSFER TORQUE MRAM WITH A NEGATIVE MAGNETIC ANISOTROPY ASSIST LAYER AND METHODS OF OPERATING THE SAME

(71) Applicant: SANDISK TECHNOLOGIES LLC, Addison, TX (US)

(72) Inventors: Quang Le, San Jose, CA (US); Zhanjie Li, Pleasanton, CA (US); Zhigang Bai, Fremont, CA (US); Paul VanderHeijden, Cupertino, CA (US); Michael Ho, Redwood City, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 220 days.

This patent is subject to a terminal disclaimer.

(21) Appl. No.: 16/880,393

(22) Filed: May 21, 2020

(65) Prior Publication Data

US 2020/0279991 A1    Sep. 3, 2020

Related U.S. Application Data

(63) Continuation of application No. 16/212,257, filed on Dec. 6, 2018, now Pat. No. 10,797,227.

(51) Int. Cl.
*H01L 43/02* (2006.01)
*H01L 43/10* (2006.01)
(Continued)

(52) U.S. Cl.
CPC ............ *H01L 43/02* (2013.01); *G11C 11/161* (2013.01); *H01F 10/329* (2013.01);
(Continued)

(58) Field of Classification Search
CPC ....... H01L 43/02; H01L 27/222; H01L 43/10; H01L 43/08; G11C 11/161;
(Continued)

(56) References Cited

U.S. PATENT DOCUMENTS 7,813,202 B2    10/2010  Rodmacq et al.
7,826,258 B2    11/2010  Zhu et al.
(Continued)

FOREIGN PATENT DOCUMENTS

EP     2209123        7/2010
JP     2005150482     6/2005
(Continued)

OTHER PUBLICATIONS

Non-Final Office Action for U.S. Appl. No. 16/902,641, dated Jul. 9, 2020, 14 pages.
(Continued)

*Primary Examiner* — Allison Bernstein
(74) *Attorney, Agent, or Firm* — The Marbury Law Group PLLC (57) ABSTRACT

A MRAM device includes a magnetic tunnel junction containing a reference layer having a fixed magnetization direction, a free layer, and a nonmagnetic tunnel barrier layer located between the reference layer and the free layer, a negative-magnetic-anisotropy assist layer having negative magnetic anisotropy that provides an in-plane magnetization within a plane that is perpendicular to the fixed magnetization direction, and a first nonmagnetic spacer layer located between the free layer and the negative-magnetic-anisotropy assist layer.

18 Claims, 7 Drawing Sheets

(51) Int. Cl.
  *H01F 10/32* (2006.01)
  *G11C 11/16* (2006.01)
  *H01L 27/22* (2006.01)
(52) U.S. Cl.
  CPC ..... *H01F 10/3254* (2013.01); *H01F 10/3272* (2013.01); *H01F 10/3286* (2013.01); *H01L 27/222* (2013.01); *H01L 43/10* (2013.01); *G11C 11/1655* (2013.01); *G11C 11/1657* (2013.01); *G11C 11/1673* (2013.01)
(58) Field of Classification Search
  CPC ............ G11C 11/1655; G11C 11/1657; G11C 11/1673; H01F 10/3254; H01F 10/3272; H01F 10/3286; H01F 10/329
  See application file for complete search history.

(56) References Cited

U.S. PATENT DOCUMENTS

| | | | |
|---|---|---|---|
| 8,085,582 B2 | 12/2011 | Nakamura et al. | |
| 8,357,982 B2 | 1/2013 | Kajiyama | |
| 8,569,852 B2 | 10/2013 | Morise et al. | |
| 8,716,817 B2 | 5/2014 | Saida et al. | |
| 8,860,156 B2 | 10/2014 | Beach et al. | |
| 8,917,543 B2 | 12/2014 | Ranjan et al. | |
| 9,019,758 B2 | 4/2015 | Huai et al. | |
| 9,025,368 B2 | 5/2015 | Saida et al. | |
| 9,025,371 B1 | 5/2015 | Huai et al. | |
| 9,166,150 B2 | 10/2015 | Doyle et al. | |
| 9,281,040 B2 | 3/2016 | Soree et al. | |
| 9,318,179 B2 | 4/2016 | Huai et al. | |
| 9,419,210 B2 | 8/2016 | Huai et al. | |
| 9,437,808 B2 | 9/2016 | Doyle et al. | |
| 9,444,039 B2 | 9/2016 | Huai et al. | |
| 9,460,397 B2 | 10/2016 | Apalkov et al. | |
| 9,461,243 B2 | 10/2016 | Guo | |
| 9,478,729 B2 | 10/2016 | Lee et al. | |
| 9,537,090 B1 | 1/2017 | Hu | |
| 9,620,706 B2 | 4/2017 | Lee et al. | |
| 9,741,929 B2 | 8/2017 | Guo | |
| 9,852,782 B2 | 12/2017 | Braganca et al. | |
| 9,853,206 B2 | 12/2017 | Pinarbasi et al. | |
| 9,978,935 B2 | 5/2018 | Hu | |
| 10,229,723 B1 | 3/2019 | Choi et al. | |
| 10,270,027 B1 | 4/2019 | Gajek et al. | |
| 10,354,710 B2 | 7/2019 | Petti et al. | |
| 10,381,551 B1 | 8/2019 | Lille | |
| 10,726,892 B2 * | 7/2020 | Le ........................ | G11C 11/161 |
| 10,862,022 B2 * | 12/2020 | Le ........................ | H01L 27/222 |
| 2002/0105823 A1 | 8/2002 | Redon et al. | |
| 2007/0133263 A1 | 6/2007 | Haratani | |
| 2009/0015958 A1 | 1/2009 | Nakamura et al. | |
| 2009/0218645 A1 | 9/2009 | Ranjan et al. | |
| 2009/0237987 A1 | 9/2009 | Zhu et al. | |
| 2011/0007560 A1 | 1/2011 | Dieny et al. | |
| 2011/0233697 A1 | 9/2011 | Kajiyama | |
| 2011/0241139 A1 | 10/2011 | Yen et al. | |
| 2012/0063218 A1 | 3/2012 | Huai et al. | |
| 2012/0242438 A1 | 9/2012 | Morise et al. | |
| 2012/0314490 A1 | 12/2012 | Okhi et al. | |
| 2013/0069185 A1 | 3/2013 | Saida et al. | |
| 2013/0181305 A1 | 7/2013 | Nakayama et al. | |
| 2013/0258764 A1 | 10/2013 | Ranjan et al. | |
| 2014/0070341 A1 | 3/2014 | Beach et al. | |
| 2014/0110804 A1 | 4/2014 | Han et al. | |
| 2014/0159175 A1 | 6/2014 | Lee et al. | |
| 2014/0160835 A1 | 6/2014 | Soree et al. | |
| 2014/0177326 A1 | 6/2014 | Doyle et al. | |
| 2014/0217487 A1 | 8/2014 | Guo | |
| 2014/0269037 A1 | 9/2014 | Saida et al. | |
| 2015/0001656 A1 | 1/2015 | Beach et al. | |
| 2015/0097159 A1 | 4/2015 | Apalkov et al. | |
| 2015/0137293 A1 | 5/2015 | Huai et al. | |
| 2015/0188035 A1 | 7/2015 | Huai et al. | |
| 2015/0188036 A1 | 7/2015 | Huai et al. | |
| 2015/0214275 A1 | 7/2015 | Hsueh et al. | |
| 2015/0340595 A1 | 11/2015 | Lee et al. | |
| 2016/0043302 A1 | 2/2016 | Doyle et al. | |
| 2016/0155931 A1 | 6/2016 | Lee et al. | |
| 2016/0197269 A1 | 7/2016 | Huai et al. | |
| 2016/0315249 A1 | 10/2016 | Kardasz et al. | |
| 2016/0336508 A1 | 11/2016 | Guo | |
| 2016/0372656 A1 | 12/2016 | Pinarbasi et al. | |
| 2016/0379698 A1 | 12/2016 | Saida et al. | |
| 2016/0380188 A1 | 12/2016 | Hu | |
| 2017/0062700 A1 | 3/2017 | Braganca et al. | |
| 2017/0084830 A1 | 3/2017 | Hu | |
| 2017/0294573 A1 | 10/2017 | Hu et al. | |
| 2017/0372763 A1 | 12/2017 | Braganca et al. | |
| 2018/0033954 A1 | 2/2018 | Aradhya et al. | |
| 2018/0108391 A1 | 4/2018 | Braganca et al. | |
| 2019/0027201 A1 | 1/2019 | Petti et al. | |
| 2019/0080738 A1 | 3/2019 | Choi et al. | |
| 2019/0103552 A1 | 4/2019 | Shiokawa et al. | |
| 2019/0131517 A1 | 5/2019 | Shiokawa et al. | |
| 2019/0165253 A1 | 5/2019 | Sun et al. | |
| 2019/0207089 A1 | 7/2019 | Kardasz et al. | |
| 2020/0006633 A1 | 1/2020 | Lille | |
| 2020/0011943 A1 | 1/2020 | Zimmer et al. | |

FOREIGN PATENT DOCUMENTS

| | | | |
|---|---|---|---|
| JP | 2015176926 A | 10/2015 | |
| KR | 20120027390 A | 3/2012 | |
| KR | 20180018779 A | 2/2018 | |

OTHER PUBLICATIONS

Le, Q. et al., "Spin Transfer Torque MRAM With a Spin Torque Oscillator Stack and Methods of Making the Same," U.S. Appl. No. 16/880,497, filed May 21, 2020.

Sbiaa, R., et al., "Spin transfer switching enhancement in perpendicular anisotropy magnetic tunnel junctions with a canted in-plane spin polarizer", Journal of Applied Physics, vol. 105, No. 1, 013910, pp. 1-6, (Jan. 6, 2009).

Liu, T. et al., "Large Enhanced Perpendicular Magnetic Anisotropy in CoFeb/MgO System with the Typical Ta Buffer Replaced by an Hf Layer," AIP Advances, vol. 2, No. 032151, pp. 032151-1 to 032151-7, (2012).

Ma, Z. et al., "Effect of 90 degree Domain Movement on the Piezoelectric Response of Patterned $PbZr_{0.2}Ti_{0.8}O_3/SrTiO_3/Si$ Heterostructures," Appl. Phys. Lett., vol. 87, No. 7, (Abstract Only), (2005), https://doi.org/10.1063/1.2012527.

Hunter, D. et al., "Giant magnetostriction in annealed $Co_{1-x}Fe_x$ thin-films," Nature Communications, Received May 25, 2011, Accepted Oct. 4, 2011, Published Nov. 1, 2011, DOI: 10.1038/ncomms1529, pp. 1-7, (2011).

Parkin, et al., "Systematic Variation of the Strength and Oscillation Period of Indirect Magnetic Exchange Coupling Through the 3d, 4d and 5d Transition Metals," Phys. Rev. Lett., vol. 67, No. 3598, (Abstract Only) (1991), https://doi.org/10.1103/PhysRevLett.67.3598.

Sambri, A. et al., "Epitaxial Piezoelectric Pb(Zr0.2Ti0.8)O3 Thin Films on Silicon for Energy Harvesting Devices," Smart Materials Research, vol. 2012, Article ID 426048, pp. 1-7, (2012).

USPTO Office Communication, Non-Final Office Action for U.S. Appl. No. 16/212,132, dated Nov. 29, 2019, 12 pages.

Notification of Transmittal of the International Search Report and Written Opinion of the International Search Authority for International Patent Application No. PCT/US2019/046783, dated Dec. 3, 2019, 10 pages.

USPTO Office Communication, Non-Final Office Action for U.S. Appl. No. 16/212,257, dated Dec. 13, 2019, 16 pages.

Notification of Transmittal of the International Search Report and Written Opinion of the International Search Authority for International Patent Application No. PCT/US2019/049189, dated Dec. 19, 2019, 16 pages.

(56) References Cited

OTHER PUBLICATIONS

USPTO Office Communication, Non-Final Office Action for U.S. Appl. No. 16/212,420, dated Nov. 27, 2019, 10 pages.
USPTO Office Communication, Non-Final Office Action for U.S. Appl. No. 16/212,342, dated May 21, 2020, 35 pages.
U.S. Appl. No. 16/212,132, filed Dec. 6, 2018, SanDisk Technologies LLC.
U.S. Appl. No. 16/212,257, filed Dec. 6, 2018, SanDisk Technologies LLC.
U.S. Appl. No. 16/212,342, filed Dec. 6, 2018, SanDisk Technologies LLC.

* cited by examiner

SPIN-TRANSFER TORQUE MRAM WITH A NEGATIVE MAGNETIC ANISOTROPY ASSIST LAYER AND METHODS OF OPERATING THE SAME

FIELD

The present disclosure relates generally to the field of magnetic memory devices and specifically to a spin-transfer torque (STT) magnetoresistive random access memory (MRAM) device with a negative magnetic anisotropy assist layer and methods of operating the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing torque to magnetize the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell depending if the magnetization of the free layer is parallel or antiparallel to the magnetization of a reference layer.

SUMMARY

According to an aspect of the present disclosure, a MRAM device includes a magnetic tunnel junction containing a reference layer having a fixed magnetization direction, a free layer, and a nonmagnetic tunnel barrier layer located between the reference layer and the free layer, a negative-magnetic-anisotropy assist layer having negative magnetic anisotropy that provides an in-plane magnetization within a plane that is perpendicular to the fixed magnetization direction, and a first nonmagnetic spacer layer located between the free layer and the negative-magnetic-anisotropy assist layer.

DETAILED DESCRIPTION

As discussed above, the present disclosure is directed to a spin-transfer torque (STT) MRAM device with a negative magnetic anisotropy assist layer and methods of operating the same, the various aspects of which are described below.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

Figure 1:
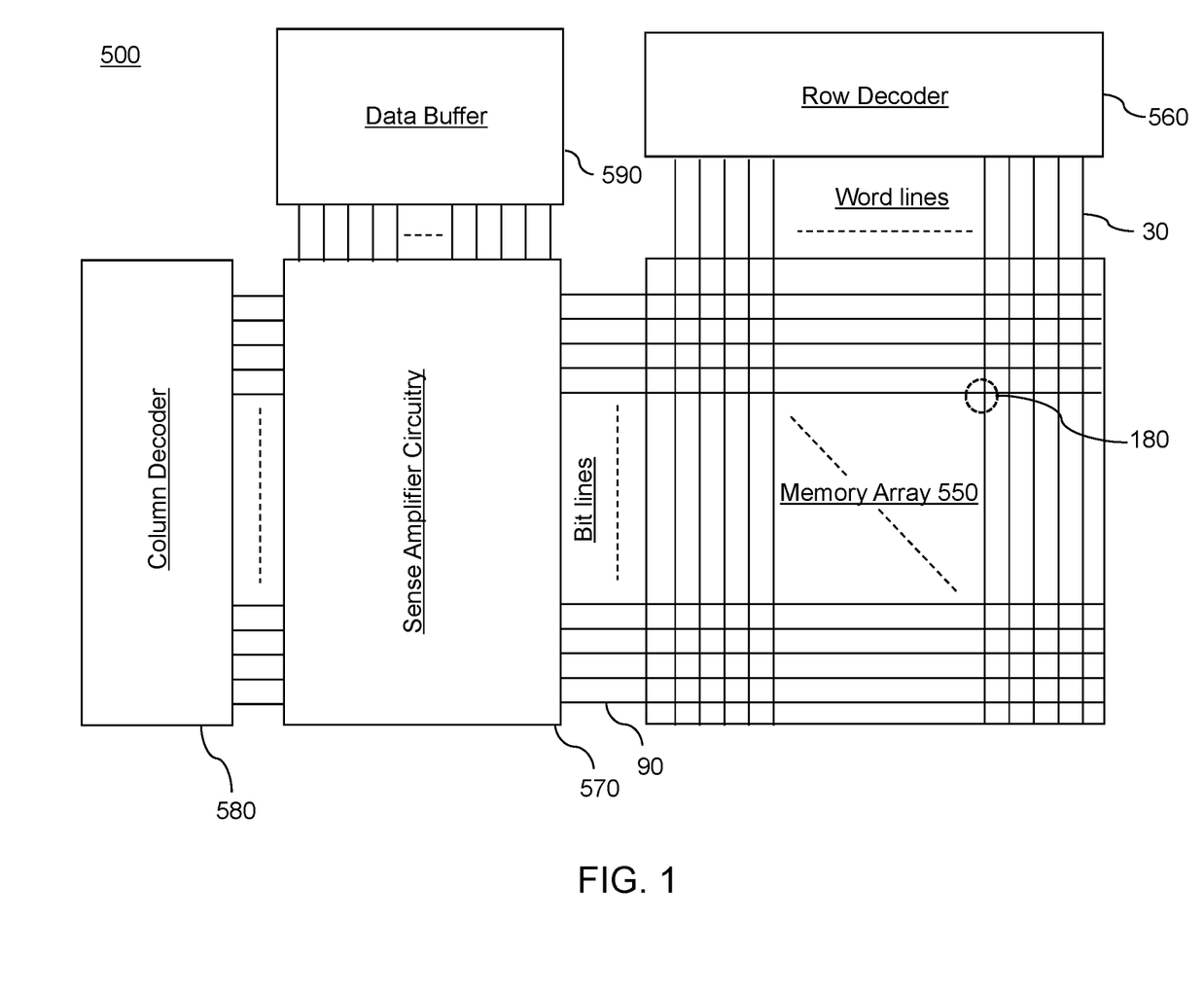
FIG. 1 is a schematic diagram of a memory device including resistive memory cells of the present disclosure in an array configuration.

Referring to FIG. 1, a schematic diagram is shown for a magnetic memory device including memory cells 180 of an embodiment present disclosure in an array configuration. The magnetic memory device can be configured as a MRAM device 500 containing MRAM cells 180. As used herein, a "MRAM device" refers to a memory device containing cells that allow random access, e.g., access to any selected memory cell upon a command for reading the contents of the selected memory cell.

The MRAM device 500 of an embodiment of the present disclosure includes a memory array region 550 containing an array of the respective MRAM cells 180 located at the intersection of the respective word lines (which may comprise electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). The MRAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the MRAM cells 180 are provided in an array configuration that forms the MRAM device 500. As such, each of the MRAM cells 180 can be a two-terminal device including a respective first electrode and a respective second electrode. It should be noted that the location and interconnection of elements are schematic and the elements may be arranged in a different configuration. Further, a MRAM cell 180 may be manufactured as a discrete device, i.e., a single isolated device.

Each MRAM cell 180 includes a magnetic tunnel junction or a spin valve having at least two different resistive states depending on the alignment of magnetizations of different magnetic material layers. The magnetic tunnel junction or the spin valve is provided between a first electrode and a second electrode within each MRAM cell 180. Configurations of the MRAM cells 180 are described in detail in subsequent sections.

Figure 2:
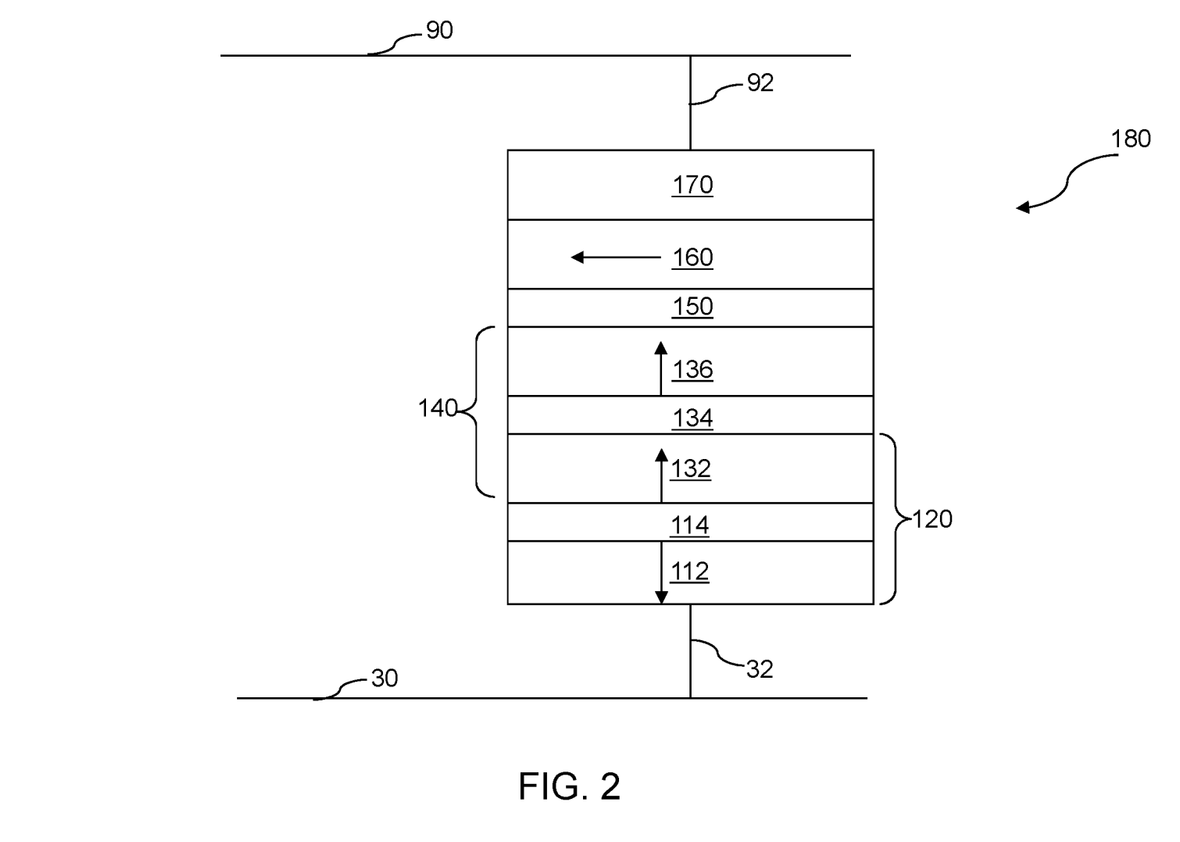
FIG. 2 illustrates a first configuration of an exemplary STT MRAM cell according to an embodiment of the present disclosure.

Referring to FIG. 2, a first configuration of an exemplary STT MRAM cell 180 is schematically illustrated. The STT MRAM cell 180 includes a magnetic tunnel junction (MTJ) 140. The magnetic tunnel junction 140 includes a reference layer 132 having a fixed vertical magnetization, a nonmagnetic tunnel barrier layer 134 located between the reference layer 132 and the free layer 136. In one embodiment, the reference layer 132 is located below the nonmagnetic tunnel barrier layer 134, while the free layer 136 is located above the nonmagnetic tunnel barrier layer 134. However, in other embodiments, the reference layer 132 is located above the nonmagnetic tunnel barrier layer 134, while the free layer 136 is located below the nonmagnetic tunnel barrier layer 134, or the reference layer 132 and the free layer 136 may be located on opposite lateral sides nonmagnetic tunnel barrier layer 134. In one embodiment, the reference layer 132 and the free layer 136 have respective positive uniaxial magnetic anisotropy.

Generally, a magnetic thin film has magnetic energy per unit volume that depends on the orientation of the magnetization of the magnetic material of the magnetic thin film. The magnetic energy per unit volume can be approximated by a polynomial of the angle $\theta$ (or of $\sin^2\theta$) between the direction of the magnetization and the vertical axis that is perpendicular to the plane of the magnetic thin film (such as a top surface or a bottom surface of the magnetic thin film) and the azimuthal angle $\phi$ between the direction of magnetization and a fixed vertical plane that is perpendicular to the plane of the magnetic thin film. The first and second order terms for the magnetic energy per unit volume as a function of $\sin^2\theta$ includes $K_1 \sin^2\theta + K_2 \sin^4\theta$. When $K_1$ is negative and $K_2$ is less than $-K_1/2$, the function $K_1 \sin^2\theta + K_2 \sin^4\theta$ has a minimum when $\theta$ is at $\pi/2$. If the magnetic anisotropy energy as a function of $\theta$ has a minimum only when $\theta$ is at $\pi/2$, the magnetization of the magnetic film prefers to stay entirely within the plane of the film, and the film is said to have "negative magnetic anisotropy." If the magnetic anisotropy energy as a function of $\theta$ has a minimum only when $\theta$ is at 0 or $\pi$, the magnetization of the magnetic film is perpendicular to the plane of the film, and the film is said to have "positive magnetic anisotropy." A thin crystalline magnetic film having positive magnetic anisotropy has a tendency for magnetization to stay perpendicular to the plane of the thin crystalline magnetic film, i.e., perpendicular to the two directions along which the thin crystalline magnetic film laterally extends. A thin crystalline magnetic film having negative magnetic anisotropy has a magnetization within the plane of the thin crystalline magnetic film, although within the film plane magnetization doesn't have a preferred orientation.

The configuration in which the reference layer 132 and the free layer 136 have respective positive uniaxial magnetic anisotropy provides bistable magnetization states for the free layer 136. The bistable magnetization states include a parallel state in which the free layer 136 has a magnetization (e.g., magnetization direction) that is parallel to the fixed vertical magnetization (e.g., magnetization direction) of the reference layer 132, and an antiparallel state in which the free layer 136 has a magnetization (e.g., magnetization direction) that is antiparallel to the fixed vertical magnetization (e.g., magnetization direction) of the reference layer 132.

The reference layer 132 can include either a Co/Ni or Co/Pt multilayer structure. The reference layer 132 can additionally include a thin non-magnetic layer comprised of tantalum having a thickness of 0.2 nm~0.5 nm and a thin CoFeB layer (having a thickness in a range from 0.5 nm to 3 nm). The nonmagnetic tunnel barrier layer 134 can include any tunneling barrier material such as an electrically insulating material, for example magnesium oxide. The thickness of the nonmagnetic tunnel barrier layer 134 can be 0.7 nm to 1.3 nm, such as about 1 nm. The free layer 136 can includes alloys of one or more of Fe, Co, and/or Ni, such as CoFeB, at a composition that provides positive uniaxial magnetic anisotropy.

In one embodiment, the reference layer 132 may be provided as a component within a synthetic antiferromagnetic structure (SAF structure) 120. The SAF structure 120 can include the reference layer 132, a fixed ferromagnetic layer 112 having a magnetization that is antiparallel to the fixed vertical magnetization, and an antiferromagnetic coupling layer 114 located between the reference layer 132 and the fixed ferromagnetic layer 112 facing the first side of the reference layer 132 opposite to the second side of the reference layer 132 which faces the nonmagnetic tunnel barrier layer 134. The antiferromagnetic coupling layer 114 has a thickness that induces an antiferromagnetic coupling between the reference layer 132 and the fixed ferromagnetic layer 112. In other words, the antiferromagnetic coupling layer 114 can lock in the antiferromagnetic alignment between the magnetization of the reference layer 132 and the magnetization of the fixed ferromagnetic layer 112 to lock in place the magnetizations of the reference layer 132 and the magnetization of the fixed ferromagnetic layer 112. In one embodiment, the antiferromagnetic coupling layer can include ruthenium and can have a thickness in a range from 0.3 nm to 1 nm.

A first nonmagnetic spacer layer 150 is provided over the second side of the free layer 136 opposite to the first side of the free layer 136 which faces the nonmagnetic tunnel barrier layer 134. The first nonmagnetic spacer layer 150 includes a nonmagnetic material such as tantalum, ruthenium, tantalum nitride, copper, copper nitride, or magnesium oxide. In one embodiment, the first nonmagnetic spacer layer 150 can include an electrically conductive metallic material. Alternatively, the first nonmagnetic spacer layer 150 can include a tunneling dielectric material such as magnesium oxide. The thickness of the first nonmagnetic spacer layer 150 can be in a range from 0.2 nm to 2 nm, although lesser and greater thicknesses can also be employed.

A negative-magnetic-anisotropy assist layer 160 can be provided over the first nonmagnetic spacer layer 150 and over the second side of the free layer 136. The negative-magnetic-anisotropy assist layer 160 can have negative magnetic anisotropy with a sufficiently negative $K_1$ value to provide an in-plane magnetization for the negative-magnetic-anisotropy assist layer 160. The in-plane magnetization is a magnetization located within a horizontal plane in FIG. 2 that is perpendicular to the fixed vertical magnetization of the reference layer 132.

In one embodiment, the hard magnetization axis is parallel to the direction normal to a major surface of the negative-magnetic-anisotropy assist layer 160 (i.e., the axis is perpendicular to the plane of the layer 160 and parallel to fixed vertical magnetization of the reference layer 132), whereas the easy magnetization plane is parallel to the plane of the negative-magnetic-anisotropy assist layer 160 (i.e., the easy magnetization plane is perpendicular to the fixed vertical magnetization of the reference layer 132 in FIG. 2). In one embodiment, within the plane (i.e., the easy magnetization plane) of the negative-magnetic-anisotropy assist layer 160, there is no easy axis direction. The negative-magnetic-anisotropy assist layer 160 is spin-coupled with the free layer 136 through the first nonmagnetic spacer layer 150.

In one embodiment, the azimuthally-dependent component of the magnetic anisotropy of the negative-magnetic-anisotropy assist layer 160 may be zero or insignificant compared to the thermal energy at room temperature, i.e., $k_B T$ in which $k_B$ is the Boltzmann constant and T is 297.15 Kelvin (which is the room temperature). For example, the maximum variation of the magnetic anisotropy per unit volume around a vertical axis that is parallel to the fixed vertical magnetization of the reference layer 132 can be less than ½ times the thermal energy at room temperature. In such cases, the magnetization of the negative-magnetic-anisotropy assist layer 160 is free to precess within the horizontal plane that is parallel to the interface between the first nonmagnetic spacer layer 150 and the negative-magnetic-anisotropy assist layer 160 upon application of electrical current through the negative-magnetic-anisotropy assist layer 160. In one embodiment, the magnetic energy of the negative-magnetic-anisotropy assist layer 160 may be invariant under rotation of the magnetization of the negative-magnetic-anisotropy assist layer 160 within the horizontal plane.

In one embodiment, the negative-magnetic-anisotropy assist layer 160 comprises a homogeneous negative magnetic anisotropy material. As used herein, a "homogeneous" material refers to a material having a uniform material composition throughout. In one embodiment, the negative-magnetic-anisotropy assist layer 160 comprises, and/or consists essentially of, a cobalt-iridium alloy. The material composition of the cobalt-iridium alloy can be selected to provide negative magnetic anisotropy. In one embodiment, the cobalt-iridium alloy can include cobalt atoms at an atomic concentration in a range from 60% to 98%, such as from 70% to 90%, for example 80%, and iridium atoms at the atomic concentration in a range from 40% to 2%, such as from 30% to 10%, for example 20%. In one embodiment, the cobalt-iridium alloy contains only cobalt, iridium and unavoidable impurities. In another embodiment, up to 5 atomic percent of elements other than cobalt and iridium may be added to the alloy. In an illustrative example, a cobalt-iridium alloy having a composition of $Co_{0.8}Ir_{0.2}$ has a $K_1$ value of about $-0.6 \times 10^6$ J/m$^3$. In another embodiment, the negative-magnetic-anisotropy assist layer 160 comprises, and/or consists essentially of, a cobalt-iron alloy. The material composition of the cobalt-iron alloy can be selected to provide negative magnetic anisotropy. In one embodiment, the cobalt-iron alloy can include cobalt atoms at an atomic concentration in a range from 80% to 99.8%, such as from 90% to 99.5%, such as 99%, and iron atoms at the atomic concentration in a range from 20% to 0.2%, such as from 10% to 0.5%, for example 1%. In an illustrative example, a cobalt-iron alloy having a composition of $Co_{0.9}Fe_{0.1}$ has a $K_1$ value of about $-0.99 \times 10^6$ J/m$^3$. The thickness of the negative-magnetic-anisotropy assist layer 160 can be in a range from 1 nm to 10 nm, such as from 1.5 nm to 6 nm, although lesser and greater thicknesses can also be employed.

In one embodiment, a nonmagnetic capping layer 170 can be located over the negative-magnetic-anisotropy assist layer 160. The nonmagnetic capping layer 170 can include a non-magnetic, electrically conductive material, such as W, Ti, Ta, WN, TiN, TaN, Ru, and Cu. The thickness of the nonmagnetic capping layer 170 can be in a range from 1 nm to 20 nm, although lesser and greater thicknesses can also be employed.

The layer stack including the material layers from the SAF structure 120 to the nonmagnetic capping layer 170 can be deposited upward or downward, i.e., from the SAF structure 120 toward the nonmagnetic capping layer 170 or from the nonmagnetic capping layer 170 toward the SAF structure 120. The layer stack can be formed as a stack of continuous layers, and can be subsequently patterned into discrete patterned layer stacks for each MRAM cell 180.

MRAM cell 180 can include a first terminal 92 that is electrically connected to or comprises a portion of a bit line 90 (shown in FIG. 1) and second terminal 32 that is electrically connected to or comprises a portion of a word line 30 (shown in FIG. 1). The location of the first and second terminals may be switched such that the first terminal is electrically connected to the SAF structure 120 and the second terminal is electrically connected to the capping layer 170.

Optionally, each MRAM cell 180 can include a dedicated steering device, such an access transistor or diode configured to activate a respective discrete patterned layer stack (120, 140, 150, 160, 170) upon application of a suitable voltage to the steering device. The steering device may be electrically connected between the patterned layer stack and one of the respective word lines 30 or bit lines 90 of the respective MRAM cell 180.

In one embodiment, the polarity of the voltage applied to the first terminal 92 can be changed depending on the polarity of the magnetization state to be programmed in the free layer 136. For example, a voltage of a first polarity can be applied to the first terminal 92 (with respect to the second terminal 32) during a transition from an antiparallel state to a parallel state, and a voltage of a second polarity (which is the opposite of the first polarity) can be applied to the first terminal 92 during a transition from a parallel state to an antiparallel state. Further, variations in the circuitry for activating the discrete patterned layer stack (120, 140, 150, 160, 170) are also contemplated herein.

The magnetization direction of the free layer 136 can be flipped (i.e., from upward to downward or vice versa) by flowing electrical current through the discrete patterned layer stack (120, 140, 150, 160, 170). The magnetization of the free layer 136 can precess around the vertical direction (i.e., the direction of the flow of the electrical current) during the programming process until the direction of the magnetization flips by 180 degrees, at which point the flow of the electrical current stops. In one embodiment, the magnetization of the negative-magnetic-anisotropy assist layer 160 can rotate freely around a vertical axis that is parallel to the fixed magnetization direction of the reference layer 132 while electrical current flows through the discrete patterned layer stack (120, 140, 150, 160, 170). This configuration allows the negative-magnetic-anisotropy assist layer 160 to provide an initial non-vertical torque to the magnetization of the free layer 136 during an initial phase of precession of the magnetization of the free layer 136 around the vertical axis that is parallel to the fixed vertical magnetization of the reference layer 132 upon initiation of flow of electrical current through the MRAM cell 180.

In one embodiment, the MRAM cell 180 can be configured to provide coupling between the in-plane magnetization of the negative-magnetic-anisotropy assist layer 160 and the magnetization of the free layer 136 during precession of the magnetization of the free layer 136 around a vertical axis that is parallel to the fixed vertical magnetization of the reference layer 132, and to provide synchronized precession of the in-plane magnetization of the negative-magnetic-anisotropy assist layer 160 and the magnetization of the free layer 136 while electrical current flows through the MRAM cell 180.

Due to the negative magnetic anisotropy of the negative-magnetic-anisotropy assist layer 160, in one embodiment, the in-plane magnetization of the negative-magnetic-anisotropy assist layer 160 can provide an initial torque to the free layer to facilitate the initiation of switching of the free layer 136. Once the free layer 136 precession starts, the free layer 136 can provide a spin torque to the negative-magnetic-anisotropy assist layer 160 to cause the negative-magnetic-anisotropy assist layer 160 magnetization to precess as well. This negative-magnetic-anisotropy assist layer 160 precession can in turn further assist the switching of the free layer 136. The embodiment negative-magnetic-anisotropy assist layer 160 which has an in-plane easy magnetization plane but which lacks a fixed easy axis direction, is more efficient than a prior art assist layer where the assist layer's magnetization direction (e.g., easy axis) is fixed.

Figure 3:
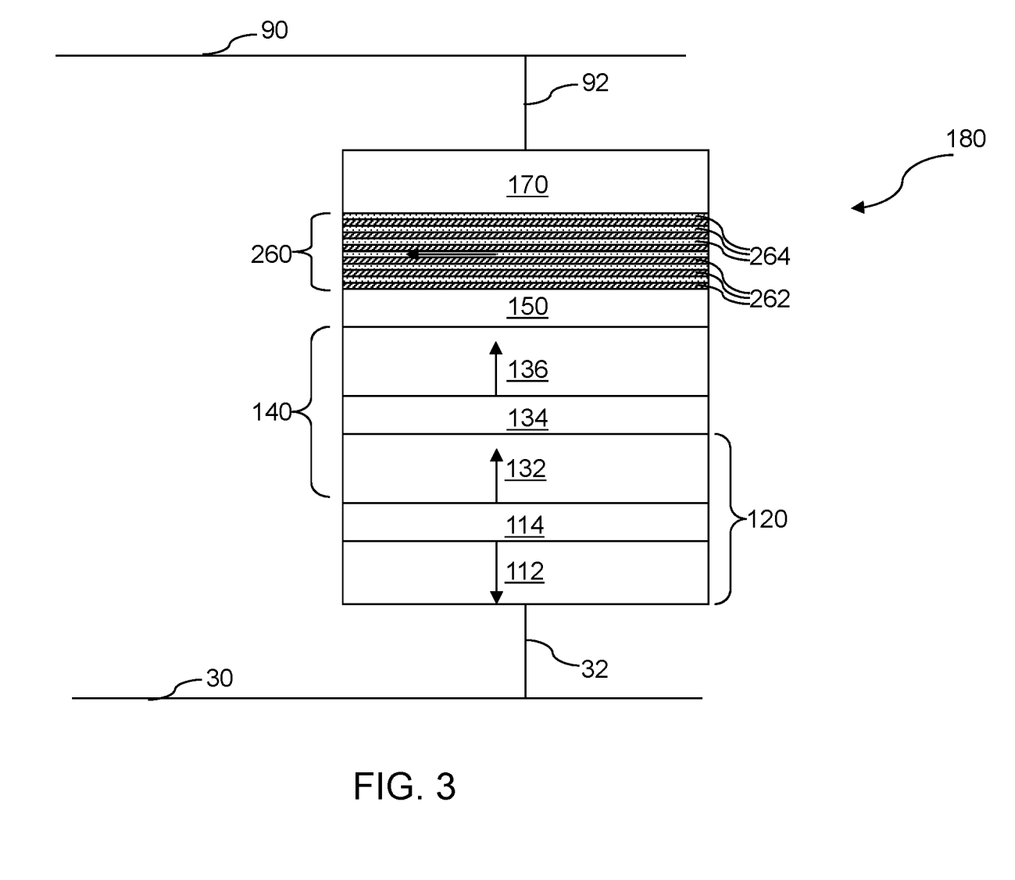
FIG. 3 illustrates a second configuration of an exemplary STT MRAM cell according to an embodiment of the present disclosure.

Referring to FIG. 3, a second configuration of the exemplary spin-transfer torque MRAM cell 180 can be derived from the first configuration of the exemplary spin-transfer torque MRAM cell 180 of FIG. 2 by replacing the negative-magnetic-anisotropy assist layer 160 having a homogeneous material composition with a negative-magnetic-anisotropy assist layer 260 including a multilayer stack (262, 264). The multilayer stack (262, 264) can include multiple repetitions of a first magnetic material layer 262 and a second magnetic material layer 264. The first magnetic material layer 262 can include, and/or can consist essentially of, a first magnetic material. The second magnetic material layer 264 can include, and/or can consist essentially of, a second magnetic material.

The composition and the thickness of each first magnetic material layer 262 and the composition and the thickness of each second magnetic material layer 264 can be selected such that the multilayer stack (262, 264) provides an in-plane magnetization, i.e., a magnetization that is perpendicular to the fixed magnetization direction of the reference layer 132 (i.e., an easy magnetization plane that is perpendicular to the fixed magnetization direction of the reference layer 132 without an easy magnetization axis). The negative-magnetic-anisotropy assist layer 260 can have negative magnetic anisotropy with a sufficiently negative $K_1$ value to provide the in-plane magnetization for the negative-magnetic-anisotropy assist layer 260.

In one embodiment, the azimuthally-dependent component of the magnetic anisotropy of the negative-magnetic-anisotropy assist layer 260 may be zero or insignificant compared to the thermal energy at room temperature. For example, the maximum variation of the magnetic anisotropy per unit volume around a vertical axis that is parallel to the fixed vertical magnetization of the reference layer 132 can be less than ½ times the thermal energy at room temperature. In such cases, the magnetization of the negative-magnetic-anisotropy assist layer 260 is free to precess within the plane that is parallel to the interface between the first nonmagnetic spacer layer 150 and the negative-magnetic-anisotropy assist layer 260 upon application of electrical current through the negative-magnetic-anisotropy assist layer 260. In one embodiment, the magnetic energy of the negative-magnetic-anisotropy assist layer 260 may be invariant under rotation of the magnetization of the negative-magnetic-anisotropy assist layer 260 within the horizontal plane.

In one embodiment, the first magnetic material layers 262 comprise cobalt, and the second magnetic material layers 264 comprise iron. In one embodiment, the first magnetic material layers 262 consist essentially of cobalt, and the second magnetic material layers 264 consist essentially of iron. The thickness of each first magnetic material layer 262 can be in a range from 0.3 nm to 1 nm, and the thickness of each second magnetic material layer 264 can be in a range from 0.3 nm to 1 nm. The total number of repetitions (i.e., the total number of pairs of a first magnetic material layer 262 and a second magnetic material layer 264) within the negative-magnetic-anisotropy assist layer 260 can be in a range from 2 to 20, such as from 4 to 10. In one embodiment, the multilayer stack (262, 264) comprises a periodic repetition of a unit layer stack that includes a first magnetic material layer 262 and a second magnetic material layer 264. In an illustrative example, a cobalt-iron multilayer stack including repetitions of a unit layer stack consisting of a cobalt layer and an iron layer having the same thickness can have a $K_1$ value of about $-1.1 \times 10^6$ J/m$^3$.

Figure 4:
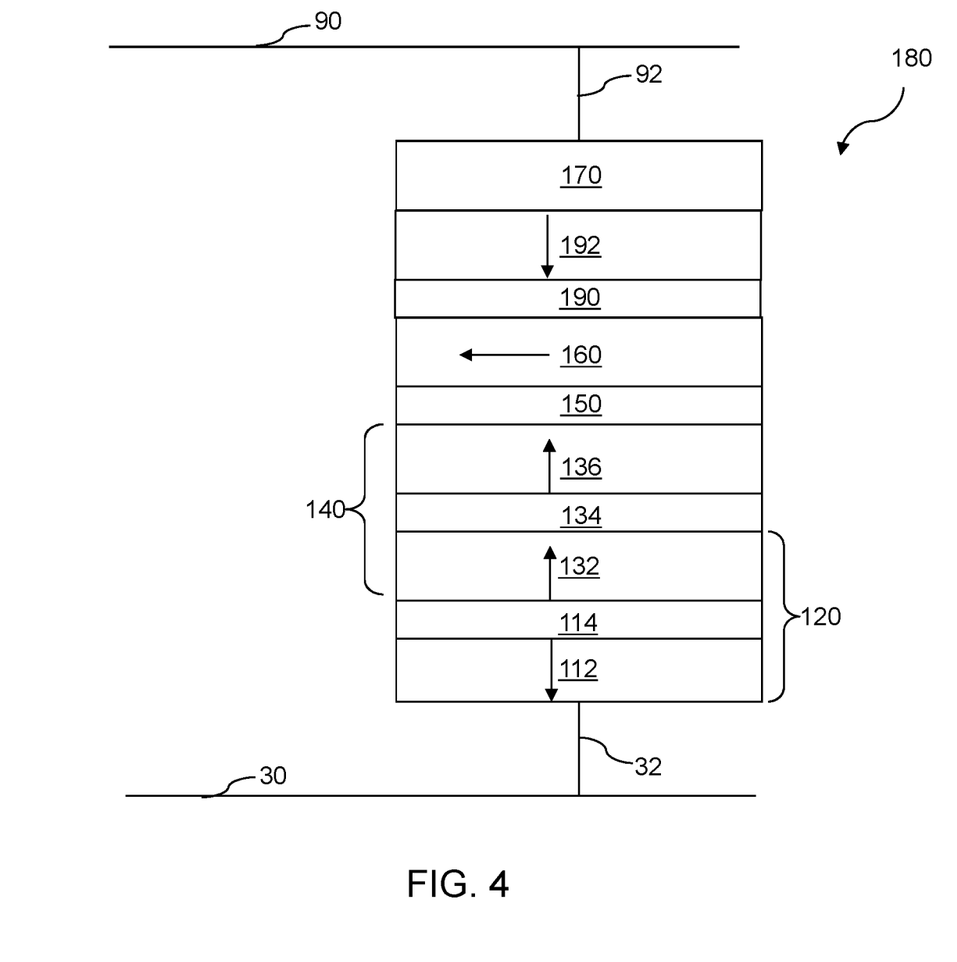
FIG. 4 illustrates a third configuration of an exemplary STT MRAM cell according to an embodiment of the present disclosure.

Referring to FIG. 4, a third configuration of the exemplary spin-transfer torque MRAM cell 180 can be derived from the first configuration of the exemplary spin-transfer torque MRAM cell 180 of FIG. 2 by inserting a second nonmagnetic spacer layer 190 and a pinned magnetization layer 192 between the negative-magnetic-anisotropy assist layer 160 and the nonmagnetic capping layer 170.

The second nonmagnetic spacer layer 190 can be located on the negative-magnetic-anisotropy assist layer 160 on the opposite side from the first nonmagnetic spacer layer 150. The second nonmagnetic spacer layer 190 includes a nonmagnetic material such as tantalum, ruthenium, tantalum nitride, copper, copper nitride, or magnesium oxide. In one embodiment, the second nonmagnetic spacer layer 190 can include an electrically conductive material. Alternatively, the second nonmagnetic spacer layer 190 can include a dielectric material such as magnesium oxide. The thickness of the second nonmagnetic spacer layer 190 can be in a range from 0.2 nm to 2 nm, although lesser and greater thicknesses can also be employed. The second nonmagnetic spacer layer 190 can include the same material as, or can include a material different from, the material of the first nonmagnetic spacer layer 150.

The pinned magnetization layer 192 is a magnetic layer which has a positive uniaxial magnetic anisotropy. In other words, the value of $K_1$ is positive and the term $K_1 \sin^2\theta$ dominates all other higher order terms and terms depending on $\sin(n\phi)$ (or $\cos(n\phi)$) in the magnetic anisotropy energy per volume for the material of the pinned magnetization layer 192. The positive uniaxial magnetic anisotropy of the pinned magnetization layer 192 provides a magnetization that is parallel or antiparallel to the fixed vertical magnetization of the reference layer 132. In one embodiment, the value of $K_1$ for the pinned magnetization layer 192 can be greater than the value of $K_1$ for the free layer 136 such that the magnetization of the pinned magnetization layer 192 stays pinned along the vertical direction, i.e., perpendicular to the interfaces among the various layers of the discrete patterned layer stack (120, 140, 150, 160, 190, 192, 170), during programming of the MRAM cell 180. The magnetization of the pinned magnetization layer 192 may remain parallel to, or antiparallel to, the magnetization of the reference layer 132.

In one embodiment, the pinned magnetization layer 192 can include either a Co/Ni or Co/Pt multilayer structure. The pinned magnetization layer 192 can additionally include a thin non-magnetic layer comprised of tantalum having a thickness of 0.2 nm~0.5 nm and a thin CoFeB layer (having a thickness in a range from 0.5 nm to 3 nm). The pinned magnetization layer 192 can cause the in-plane magnetization of the negative-magnetic-anisotropy assist layer 160 to oscillate. The oscillation of the in-plane magnetization of the negative-magnetic-anisotropy assist layer 160 can produce a rotating spin torque on the magnetization of the free layer 136 during programming, and thus, can help the switching of the magnetization of the free layer 136 with a lower electrical current through the discrete patterned layer stack (120, 140, 150, 160, 190, 192, 170). In one embodiment, the combination of the magnetization of the pinned magnetization layer 192 and the negative-magnetic-anisotropy assist layer 160 applies a non-horizontal and non-vertical magnetic field (i.e., a field which is neither parallel to nor perpendicular to the direction of the magnetization of the reference layer 132) on the magnetization of the free layer 136 to reduce the magnitude of the required electrical current through the discrete patterned layer stack (120, 140, 150, 160, 190, 192, 170) during switching of the magnetization of the free layer 136.

Figure 5:
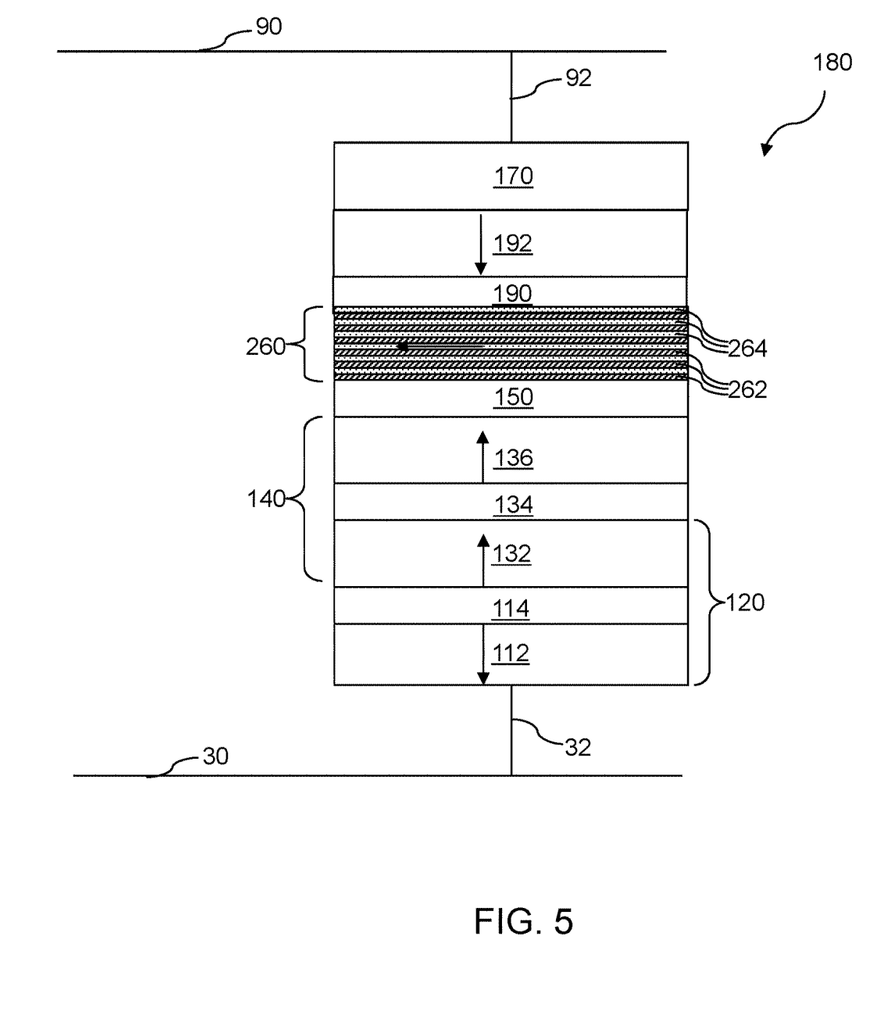
FIG. 5 illustrates a fourth configuration of an exemplary STT MRAM cell according to an embodiment of the present disclosure.

Referring to FIG. 5, a fourth configuration of the exemplary spin-transfer torque MRAM cell 180 can be derived from the third configuration of the exemplary spin-transfer torque MRAM cell 180 of FIG. 4 by replacing the negative-magnetic-anisotropy assist layer 160 having a homogeneous material composition with the negative-magnetic-anisotropy assist layer 260 containing the multilayer stack (262, 264) that includes multiple repetitions of a first magnetic material layer 262 and a second magnetic material layer 264 that was described above with respect to FIG. 3.

Referring to all configurations of the exemplary spin-transfer torque MRAM cell 180 illustrated in FIGS. 1-5, the exemplary spin-transfer torque MRAM cell 180 can be programmed and read individually. Reading, i.e., sensing, the magnetization state of the free layer 136 can be performed by applying a read bias voltage across the first terminal 92 and the second terminal 32 of a selected discrete patterned layer stack {120, 140, 150, (160 or 260), 170} or {120, 140, 150, (160 or 260), (190, 192), 170}. The parallel or antiparallel alignment between the magnetization of the free layer 136 and the reference layer 132 determines the electrical resistance of the selected discrete patterned layer stack in each MRAM cell 180, and thus, determines the magnitude of the electrical current that flows between the first terminal 92 and the second terminal 32. The magnitude of the electrical current can be sensed to determine the magnetization state of the free layer 136 and the data encoded by the detected magnetization state.

Programming of the exemplary spin-transfer torque MRAM cell 180 to the opposite magnetization state for the free layer 136 can be performed by flowing electrical current through the selected discrete patterned layer stack {120, 140, 150, (160 or 260), 170} or {120, 140, 150, (160 or 260), (190, 192), 170} and by inducing the flipping, i.e., the switching, of the direction of the magnetization of the free layer 136. Specifically, electrical current can be flowed through a selected discrete patterned layer stack which includes a magnetic tunnel junction 140, a first nonmagnetic spacer layer 150, and a negative-magnetic-anisotropy assist layer (160 or 260). The in-plane magnetization of the negative-magnetic-anisotropy assist layer (160 or 260) provides an initial non-vertical torque to the magnetization of the free layer 136 during an initial phase of precession of the magnetization of the free layer 136 around a vertical axis that is parallel to the fixed vertical magnetization of the reference layer 132 upon initiation of flow of the electrical current through the magnetic tunnel junction 140, the first nonmagnetic spacer layer 150, and the negative-magnetic-anisotropy assist layer (160 or 260).

Figure 6A:
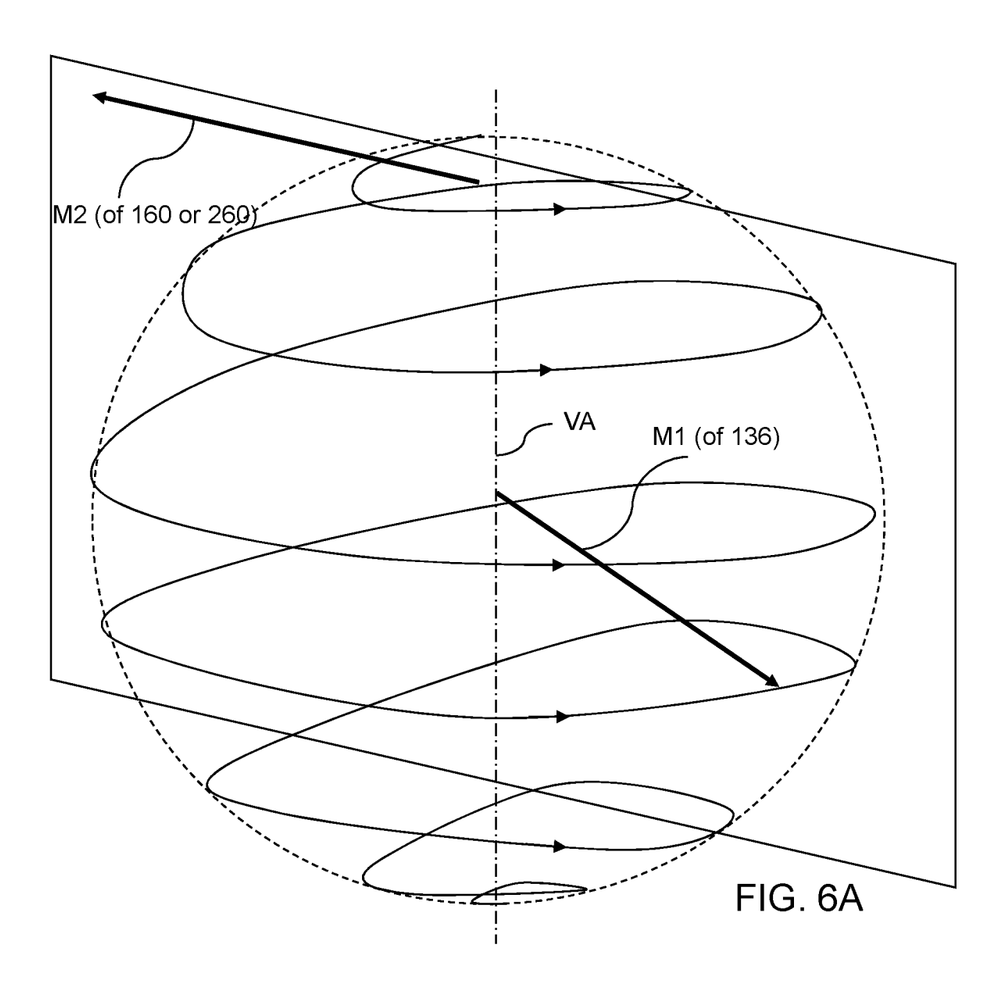
FIG. 6A illustrates an exemplary precession pattern during transition of the spin of a free layer from an up state to a down state.
Figure 6B:
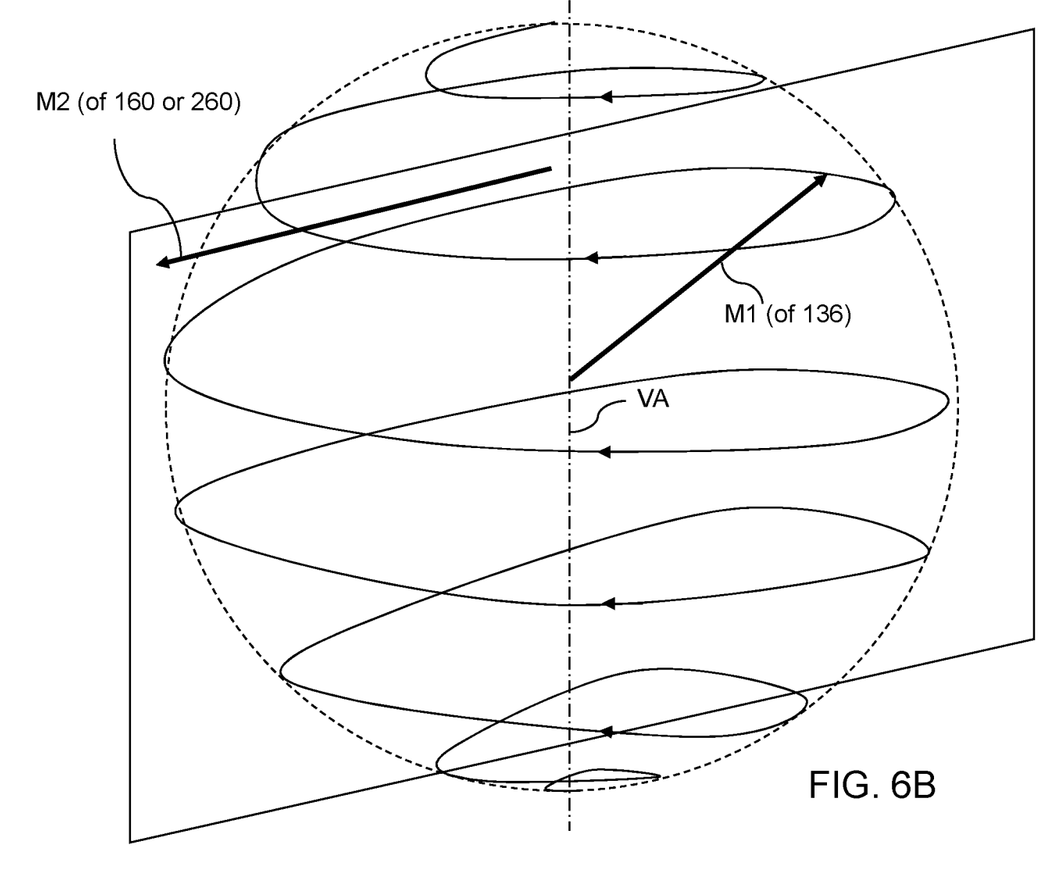
FIG. 6B illustrates an exemplary precession pattern during transition of the spin of a free layer from a down state to an up state.

In one embodiment, the in-plane magnetization of the negative-magnetic-anisotropy assist layer (160 or 260) couples with a magnetization of the free layer 136 during precession of the magnetization of the free layer 136 around the vertical axis (VA) that is parallel to the fixed vertical magnetization of the reference layer 132 to provide synchronized precession of the in-plane magnetization M2 of the negative-magnetic-anisotropy assist layer (160 or 260) and the magnetization M1 of the free layer 136 while electrical current flows through the MRAM cell 180 as illustrated in FIGS. 6A and 6B. FIG. 6A illustrates a transition of the magnetization M1 of the free layer 136 from an "up" state to a "down" state, and FIG. 6B illustrates a transition of the magnetization M1 of the free layer 136 from a "down" state to an "up" state. In one embodiment, the in-plane magnetization M2 of the negative-magnetic-anisotropy assist layer (160 or 260) and the magnetization M1 of the free layer 136 may remain within a same rotating vertical plane during the switching of the magnetization of the free layer 136. The coupling between the horizontal (in-plane) component of the magnetization M1 of the free layer 136 and the in-plane magnetization M2 of the negative-magnetic-anisotropy assist layer (160 or 260) may be antiferromagnetic or ferromagnetic. FIGS. 6A and 6B illustrate an example in which the coupling between the horizontal (in-plane) component of the magnetization M1 of the free layer 136 and the in-plane magnetization M2 of the negative-magnetic-anisotropy assist layer (160 or 260) is antiferromagnetic during the switching of the magnetization of the free layer 136.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A MRAM device comprising:
a magnetic tunnel junction comprising a reference layer having a fixed magnetization direction, a free layer, and a nonmagnetic tunnel barrier layer located between the reference layer and the free layer;
a negative-magnetic-anisotropy assist layer having negative magnetic anisotropy that provides an in-plane magnetization within a plane that is perpendicular to the fixed magnetization direction, wherein the negative-magnetic-anisotropy assist layer comprises a first magnetic material layer and a second magnetic material layer; and
a first nonmagnetic spacer layer located between the free layer and the negative-magnetic-anisotropy assist layer.

2. The MRAM device of claim 1, wherein:
the negative-magnetic-anisotropy assist layer has an easy magnetization plane that is perpendicular to the fixed magnetization of the reference layer; and
the negative-magnetic-anisotropy assist layer has no easy axis direction within the easy magnetization plane.

3. The MRAM device of claim 1, wherein:
the free layer has positive magnetic anisotropy to provide bistable magnetization states that include a parallel state having a magnetization that is parallel to the fixed vertical magnetization and an antiparallel state having a magnetization that is antiparallel to the fixed vertical magnetization; and
magnetic energy of the negative-magnetic-anisotropy assist layer is invariant under rotation of the magnetization of the negative-magnetic-anisotropy assist layer within the horizontal plane.

4. The MRAM device of claim 1, further comprising a synthetic antiferromagnetic structure comprising the reference layer, a fixed ferromagnetic layer having a magnetization that is antiparallel to the fixed magnetization direction of the reference layer, and an antiferromagnetic coupling layer located between the reference layer and the fixed ferromagnetic layer.

5. The MRAM device of claim 1, further comprising a nonmagnetic capping layer located over the negative-magnetic-anisotropy assist layer.

6. A method of operating a MRAM device, comprising:
providing the MRAM device of claim 1; and
flowing current through the magnetic tunnel junction, the first nonmagnetic spacer layer, and the negative-magnetic-anisotropy assist layer.

7. The method of claim 6, wherein the negative-magnetic-anisotropy assist layer provides an initial torque to a magnetization of the free layer during an initial phase of precession of the magnetization of the free layer around a vertical axis that is parallel to the fixed magnetization direction of the reference layer upon initiation of the flowing of the current through the MRAM device.

8. The method of claim 7, wherein:
coupling occurs between an in-plane magnetization of the negative-magnetic-anisotropy assist layer and the magnetization of the free layer during precession of the magnetization of the free layer around a vertical axis that is parallel to the fixed magnetization direction of the reference layer, and synchronized precession of the in-plane magnetization of the negative-magnetic-anisotropy assist layer and the magnetization of the free layer occurs while the flowing of the current continues through the MRAM device.

9. The method of claim 6, wherein:
the negative-magnetic-anisotropy assist layer has an easy magnetization plane that is perpendicular to the fixed magnetization of the reference layer; and
the negative-magnetic-anisotropy assist layer has no easy axis direction within the easy magnetization plane.

10. The MRAM device of claim 1, wherein the first magnetic material layer comprises a different magnetic material than the second magnetic material layer.

11. The MRAM device of claim 1, wherein:
the first magnetic material layer comprises cobalt; and
the second magnetic material layer comprises iron.

12. The MRAM device of claim 1, wherein the first nonmagnetic spacer layer contacts both the free layer and the negative-magnetic-anisotropy assist layer.

13. The MRAM device of claim 1, further comprising a pinned magnetization layer having positive uniaxial magnetic anisotropy which provides a magnetization direction that is parallel or antiparallel to the fixed magnetization direction of the reference layer.

14. A MRAM device comprising:
a magnetic tunnel junction comprising a reference layer having a fixed magnetization direction, a free layer, and a nonmagnetic tunnel barrier layer located between the reference layer and the free layer;
a negative-magnetic-anisotropy assist layer having negative magnetic anisotropy that provides an in-plane magnetization within a plane that is perpendicular to the fixed magnetization direction;
a first nonmagnetic spacer layer located between the free layer and the negative-magnetic-anisotropy assist layer; and
a pinned magnetization layer having positive uniaxial magnetic anisotropy which provides a magnetization direction that is parallel or antiparallel to the fixed magnetization direction of the reference layer, and is more proximal to the free layer than to the reference layer.

15. The MRAM device of claim 14, wherein:
the negative-magnetic-anisotropy assist layer has an easy magnetization plane that is perpendicular to the fixed magnetization of the reference layer; and
the negative-magnetic-anisotropy assist layer has no easy axis direction within the easy magnetization plane.

16. The MRAM device of claim 14, wherein:
the free layer has positive magnetic anisotropy to provide bistable magnetization states that include a parallel state having a magnetization that is parallel to the fixed vertical magnetization and an antiparallel state having a magnetization that is antiparallel to the fixed vertical magnetization; and
magnetic energy of the negative-magnetic-anisotropy assist layer is invariant under rotation of the magnetization of the negative-magnetic-anisotropy assist layer within the horizontal plane.

17. The MRAM device of claim 14, wherein the negative-magnetic-anisotropy assist layer comprises a homogeneous negative magnetic anisotropy material.

18. A method of operating a MRAM device, comprising:
providing the MRAM device of claim 14; and
flowing current through the magnetic tunnel junction, the first nonmagnetic spacer layer, and the negative-magnetic-anisotropy assist layer, wherein the negativemagnetic-anisotropy assist layer provides an initial torque to a magnetization of the free layer during an initial phase of precession of the magnetization of the free layer around a vertical axis that is parallel to the fixed magnetization direction of the reference layer upon initiation of the flowing of the current through the MRAM device.

* * * * *